(12) United States Patent
Suzuki

(10) Patent No.: US 10,061,334 B2
(45) Date of Patent: Aug. 28, 2018

(54) VOLTAGE REGULATOR

(71) Applicant: SII Semiconductor Corporation, Chiba-shi, Chiba (JP)

(72) Inventor: Teruo Suzuki, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/791,693

(22) Filed: Oct. 24, 2017

(65) Prior Publication Data
US 2018/0120875 A1 May 3, 2018

(30) Foreign Application Priority Data

Nov. 2, 2016 (JP) .................................. 2016-215350

(51) Int. Cl.
*G05F 1/00* (2006.01)
*G05F 1/565* (2006.01)
*H03K 17/08* (2006.01)

(52) U.S. Cl.
CPC ............. *G05F 1/565* (2013.01); *H03K 17/08* (2013.01)

(58) Field of Classification Search
CPC ..... G05F 1/40; G05F 1/42; G05F 1/44; G05F 1/462; G05F 1/52; G05F 1/56; H02M 3/10; H02M 3/125; H02M 3/156; H02M 3/157
See application file for complete search history.

(56) References Cited

U.S. PATENT DOCUMENTS

| 6,828,764 B2 * | 12/2004 | Takimoto | ................ H02J 7/041 320/128 |
| 2012/0194149 A1 | 8/2012 | Noda | |

FOREIGN PATENT DOCUMENTS

JP          2012160048          8/2012

* cited by examiner

*Primary Examiner* — Adolf Berhane
*Assistant Examiner* — Afework Demisse
(74) *Attorney, Agent, or Firm* — Brinks Gilson & Lione

(57) ABSTRACT

A voltage regulator includes an output transistor controlled by an error amplifier, first and second resistors connected in series between an output terminal and a ground terminal via a first node, third and fourth resistors connected in series between a load voltage monitoring terminal and the ground terminal via a second node, and a fifth resistor and a switching transistor connected in series between the first node and the ground terminal. When a voltage which is supplied to a load connected to the output terminal drops due to a parasitic resistance, a voltage at the second node falls below that of the first node. The switching transistor, then, turns on to connect the fifth resistor in parallel to the second resistor to lower the voltage at the first node. Feedback of this voltage to the error amplifier raises the voltage at the output terminal to a desired value.

16 Claims, 5 Drawing Sheets

VOLTAGE REGULATOR

RELATED APPLICATIONS

This application claims priority under 35 U.S.C. § 119 to Japanese Patent Application No. 2016-215350 filed on Nov. 2, 2016, the entire content of which is hereby incorporated by reference.

BACKGROUND OF THE INVENTION

1. Field of the Invention

The present invention relates to a voltage regulator.

2. Description of the Related Art

A voltage regulator in the related art generally includes an output transistor having a drain connected to an output terminal, a voltage divider (resistor) circuit configured to divide a voltage at the output terminal to generate a feedback voltage, and an error amplifier configured to output a signal that is obtained by amplifying a difference between the feedback voltage and a reference voltage, thereby supplying a signal output from the error amplifier to a gate of the output transistor to generate a constant output voltage at the output terminal.

To the output terminal of such a voltage regulator, a power supply input terminal of an external load, for example, a CPU is connected, and the external load operates with an output voltage of the voltage regulator.

Voltage drop occurs, however, due to a parasitic resistance since the parasitic resistance exists on a connection path between the output terminal of the voltage regulator and the power supply input terminal of the external load, and a current flows from a power supply terminal of the voltage regulator to the external load through the output transistor, the output terminal, and the parasitic resistance. This means that a voltage that is actually supplied to the external load as a power supply voltage is lower than a voltage at the output terminal of the voltage regulator by the amount of voltage drop due to the parasitic resistance.

To handle the problem, in Japanese Patent Application Laid-open No. 2012-160048, as illustrated in FIG. 1 of this literature, in addition to a terminal T1 to which an output voltage VOUT is output, a terminal T2 which is connected to a power supply input terminal of an external load 10 for monitoring a voltage VP at the external load 10 is provided. A voltage divider circuit (Rf3 and Rf4) is connected to the terminal T2. With this configuration, it is possible to perform control so that not the output voltage VOUT but the voltage VP which is actually supplied to the external load 10 is set to a desired voltage.

However, the terminal T2 for monitoring the voltage VP at the load 10 which is disclosed in Japanese Patent Application Laid-open No. 2012-160048 has high impedance, and hence a voltage Vf that is fed back from a voltage dividing point of the voltage divider circuit (Rf3 and Rf4) to an error amplifier OP1 is affected by external noise, and is liable to fluctuate. The output voltage VOUT is unstable as a result.

SUMMARY OF THE INVENTION

It is an object of the present invention to provide a voltage regulator capable of raising a voltage that is supplied to an external load which is connected to an output terminal to a desired voltage when the voltage that is supplied to the external load becomes lower with respect to a voltage at the output terminal because of a voltage drop due to a parasitic resistance, and of preventing an effect of external noise to an output voltage, thereby permitting generation of a stable output voltage.

According to one embodiment of the present invention, there is provided a voltage regulator comprising:

an output transistor having a source connected to a first power supply terminal;

an output terminal from which a voltage at a drain of the output transistor is output, and connected to a power supply input terminal of an external load;

a first voltage divider circuit having a first resistor and a second resistor connected in series between the drain of the output transistor and a second power supply terminal via a first node;

a load voltage monitoring terminal to which a voltage at the power supply input terminal of the external load is input;

a second voltage divider circuit having a third resistor and a fourth resistor connected in series between the load voltage monitoring terminal and the second power supply terminal via a second node;

a fifth resistor and a switching transistor both connected in series between the first node and the second power supply terminal; and a comparator connected between the first power supply terminal and the second power supply terminal, and is configured to: compare a voltage at the first node and a voltage at the second node to each other; and output a signal for turning on the switching transistor when the voltage at the second node falls below the voltage at the first node by a predetermined voltage amount or more, a ratio between a resistance value of the first resistor and a resistance value of the second resistor being the same as a ratio between a resistance value of the third resistor and a resistance value of the fourth resistor, and a voltage at a gate of the output transistor being reduced so that a voltage at the output terminal is raised when the voltage at the first node falls below a reference voltage.

According to the voltage regulator of the present invention, the voltage at the first node of the first voltage divider circuit and the voltage at the second node of the second voltage divider circuit are compared to each other, and the switching transistor is turned on when the voltage at the second node falls below the voltage at the first node by the predetermined voltage amount or more. The fifth resistor is consequently connected in parallel to the second resistor of the first voltage divider circuit. When the voltage at the first node drops to fall below the reference voltage, the voltage at the output terminal rises, and a voltage that is supplied to the power supply input terminal of the external load can thus be raised to a desired voltage.

Further, the voltage at the second node of the second voltage divider circuit is affected by external noise, and is liable to fluctuate because the load voltage monitoring terminal has high impedance. However, the comparator is configured to output a signal for turning on the switching transistor when the voltage at the second node falls below the voltage at the first node by the predetermined voltage amount or more, and does not output the signal for turning on the switching transistor when the voltage at the second node fluctuates (drops) due to external noise by less than the predetermined voltage amount. It is therefore possible to prevent an effect of noise to the output voltage, thereby permitting generation of a stable output voltage.

DETAILED DESCRIPTION OF THE PREFERRED EMBODIMENTS

Now, embodiments of the present invention are described with reference to the drawings.

First Embodiment

Figure 1:
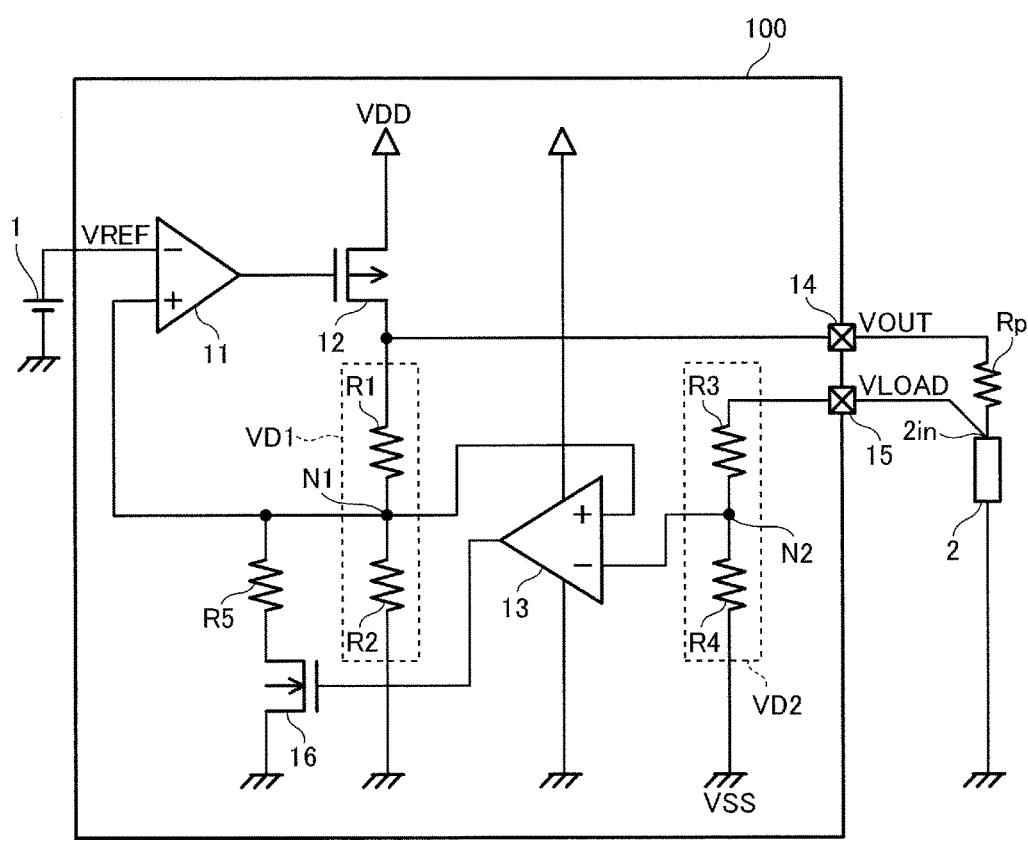
FIG. 1 is a circuit diagram for illustrating a voltage regulator according to a first embodiment of the present invention.

FIG. 1 is a circuit diagram of a voltage regulator 100 according to a first embodiment of the present invention.

The voltage regulator 100 includes an error amplifier 11, an output transistor 12, a comparator 13, an output terminal 14, a load voltage monitoring terminal 15, a switching transistor 16, voltage divider circuits VD1 and VD2, and a resistor R5.

The output transistor 12 and the voltage divider circuit VD1 are connected in series between a power supply terminal VDD (also referred to as "first power supply terminal") and a ground terminal VSS (also referred to as "second power supply terminal"). The voltage divider circuit VD1 includes resistors R1 and R2 that are connected in series between a drain of the output transistor 12 and the ground terminal VSS via a node N1.

The voltage divider circuit VD2 is connected between the load voltage monitoring terminal 15 and the ground terminal VSS, and includes resistors R3 and R4 that are connected in series via a node N2.

A ratio between the resistance values of the resistor R1 and the resistor R2 and a ratio between the resistance values of the resistor R3 and the resistor R4 are set to the same value.

The comparator 13 has a non-inverting input terminal connected to the node N1 and an inverting input terminal connected to the node N2, and is configured to output a signal at a high level when a voltage at the node N2 falls below a voltage at the node N1 by a predetermined voltage amount or more. That is, an offset of the predetermined voltage amount is added to the inverting input terminal of the comparator 13.

The resistor R5 and the switching transistor 16 are connected in series between the node N1 and the ground terminal VSS. A gate of the switching transistor 16 is connected to an output of the comparator 13.

The error amplifier 11 has an inverting input terminal connected to a reference voltage circuit 1, which is configured to generate a reference voltage VREF, and a non-inverting input terminal connected to the node N1. An output of the error amplifier 11 is connected to a gate of the output transistor 12. The drain of the output transistor 12 is connected to the output terminal 14.

To the output terminal 14, an output voltage VOUT of the voltage regulator 100 is output, and the output terminal 14 is connected to a power supply input terminal 2in of an external load 2. A parasitic resistance Rp exists on a path between the output terminal 14 and the power supply input terminal 2in.

The power supply input terminal 2in of the external load 2 is connected to the load voltage monitoring terminal 15, and hence a voltage at the power supply input terminal 2in is input to the load voltage monitoring terminal 15 as a voltage VLOAD.

In the voltage regulator 100 configured as described above, when a current flows through the external load 2, the current flows through the parasitic resistance Rp, and the voltage drop thus occurs by the amount of a multiplication of the parasitic resistance Rp and the current. The voltage at the power supply input terminal 2in of the external load 2 is consequently lower than the output voltage VOUT by the amount of the voltage drop.

In this case, when a small current flows through the external load 2, the voltage drop due to the parasitic resistance Rp is also small. Since a voltage at almost the same level as the output voltage VOUT is input to the power supply input terminal 2in of the external load 2, the external load 2 can operate on this voltage.

When a large current flows through the external load 2, on the other hand, the voltage drop due to the parasitic resistance Rp is significantly large. Hence, even when the output voltage VOUT is set to a desired voltage necessary for the operation of the external load 2, a voltage that is actually input to the power supply input terminal 2in is greatly lower than the desired voltage. As a result, the operation of the external load 2 is affected, for example, the external load 2 malfunctions.

Accordingly the voltage at the power supply input terminal 2in of the external load 2 should be controlled to have the desired voltage necessary for the operation of the external load 2 when a large current flows though the external load 2.

The voltage regulator 100 of the first embodiment thus operates as follows.

When a large current flows through the external load 2, the voltage VLOAD at the power supply input terminal 2in falls below the output voltage VOUT at the output terminal 14 by a great amount because the voltage drop occurs due to the parasitic resistance Rp. The comparator 13 outputs a signal at the high level when the voltage at the node N2, which is obtained by dividing the voltage VLOAD by the voltage divider circuit VD2, consequently falls below the voltage at the node N1, which is obtained by dividing the output voltage VOUT by the voltage divider circuit VD1, by the predetermined voltage amount or more. The switching transistor 16 that includes an NMOS transistor is thus turned on.

When the switching transistor 16 is turned on, the resistor R5 is consequently connected in parallel to the resistor R2 of the voltage divider circuit VD1. Then, the voltage at the node N1 drops. Thus, an output voltage of the error amplifier 11 drops, and a current that flows through the output transistor 12 increases, with the result that the output voltage VOUT at the output terminal 14 rises.

In this way, a voltage that is supplied to the power supply input terminal 2in of the external load 2 can be raised to the desired voltage.

In contrast to this, when a small current flows through the external load 2, and the voltage drop due to the parasitic resistance Rp is small enough to ignore, the output of the comparator 13 is maintained at a low level unless the voltage drops by more than the predetermined voltage, because the offset of the predetermined voltage amount is added to the inverting input terminal of the comparator 13 as described above. The switching transistor 16, which is controlled by the output of the comparator 13, is consequently kept in an off state. Thus, the voltage at the node N1 does not drop, and the output voltage VOUT at the output terminal 14 does not change.

Further, the load voltage monitoring terminal 15 has high impedance, and hence the voltage at the node N2 of the voltage divider circuit VD2 is liable to fluctuate by the effect of external noise. However, according to the first embodiment, even when the voltage at the node N2 fluctuates and slightly drops by the effect of noise, the output of the comparator 13 is maintained at the low level unless the voltage drops by more than the above-mentioned predetermined voltage, as in the case in which the voltage drop due to the parasitic resistance Rp is smaller than the predetermined voltage as described above. The switching transistor 16 is, thus, kept in the off state, and the voltage at the node N1 does not drop. It is therefore possible to prevent the output voltage VOUT at the output terminal 14 from the effect of external noise, to thereby generate a stable output voltage.

Here, a parasitic resistance (not shown) also exists on a path between the load voltage monitoring terminal 15 and the power supply input terminal 2in, but only a minute current flows from the power supply input terminal 2in to the ground terminal VSS through the load voltage monitoring terminal 15 and the resistors R3 and R4. Hence, the voltage at the power supply input terminal 2in is at substantially the same level as the voltage VLOAD at the load voltage monitoring terminal 15 all the time. Because of this, the voltages are regarded as being equal to each other in the above description, which includes the expression "voltage VLOAD at power supply input terminal 2in", for example.

As described above, the expected effect may be obtained when the ratio between the resistance values of the resistor R1 and the resistor R2 and the ratio between the resistance values of the resistor R3 and the resistor R4 are set to the same value. However, it is more preferred that the voltage divider circuit VD1 and the voltage divider circuit VD2 have the same structure. With this configuration, when a large current flows through the external load 2, a voltage that is supplied to the power supply input terminal 2in can be set to the desired voltage with a higher accuracy.

Other embodiments of the present invention are next described with reference to FIG. 2 to FIG. 5. With regard to voltage regulators illustrated in FIG. 2 to FIG. 5, the same components as those of the voltage regulator 100 illustrated in FIG. 1 are denoted by the same reference symbols, and overlapping description is omitted as appropriate.

Second Embodiment

Figure 2:
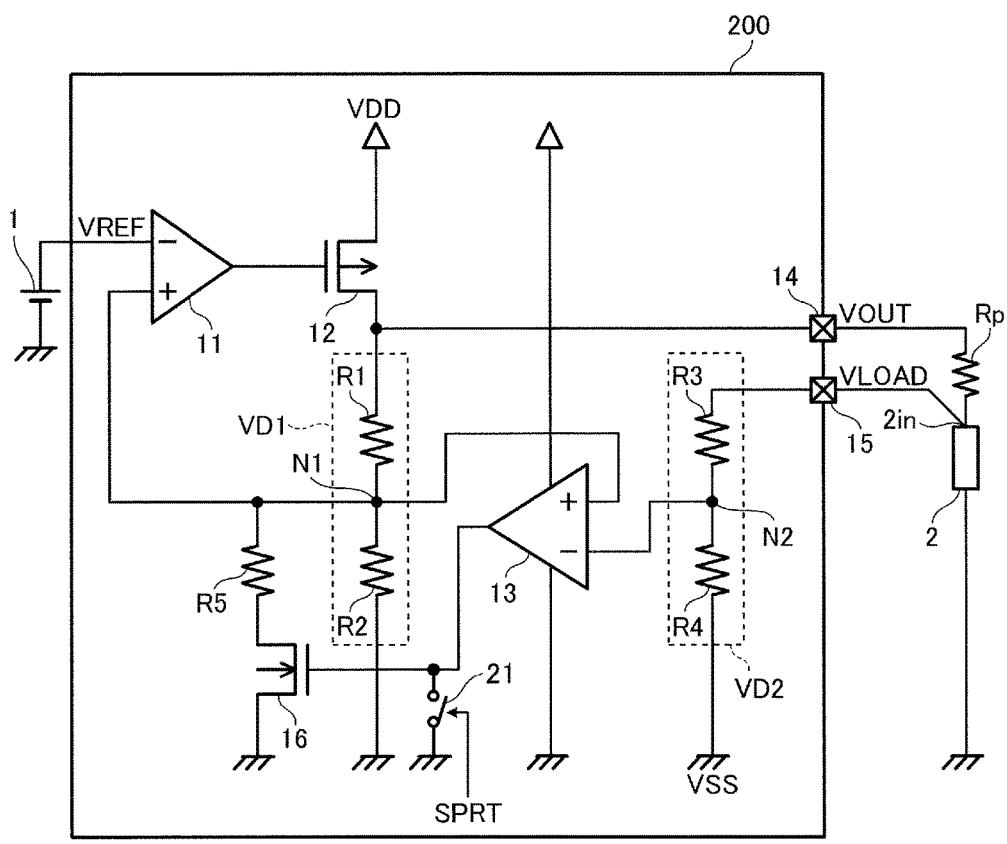
FIG. 2 is a circuit diagram for illustrating a voltage regulator according to a second embodiment of the present invention.

FIG. 2 is a circuit diagram of a voltage regulator 200 according to a second embodiment of the present invention.

The voltage regulator 200 includes, in addition to the components of the voltage regulator 100, a switch 21 connected between the gate of the switching transistor 16 and the ground terminal VSS.

The switch 21 is controlled to turn on and off by a signal SPRT. The signal SPRT is a signal that is output from a protection circuit (not shown) for an overcurrent protection circuit, for example, which is separately provided in the voltage regulator 200, when the protection circuit operates (functions).

In the voltage regulator 200 configured as described above, the switch 21 is turned on by the signal SPRT output from the protection circuit when the protection circuit is operating. Consequently, even when the voltage at the node N2 falls below the voltage at the node N1 by the predetermined voltage amount or more, and the comparator 13 outputs a signal at the high level, the voltage at the gate of the switching transistor 16 is set to a voltage at the ground terminal VSS by the switch 21.

When operating, the protection circuit causes the output voltage VOUT at the output terminal 14 to drop, and hence a rise in the output voltage VOUT at the output terminal 14 leads to the malfunction of the protection circuit. However, according to the second embodiment, through turning on of the switch 21, the gate of the switching transistor 16 is forcibly reduced to the low level to suppress a rise in the output voltage VOUT at the output terminal 14. In this way, malfunction of the protection circuit can be prevented.

Third Embodiment

Figure 3:
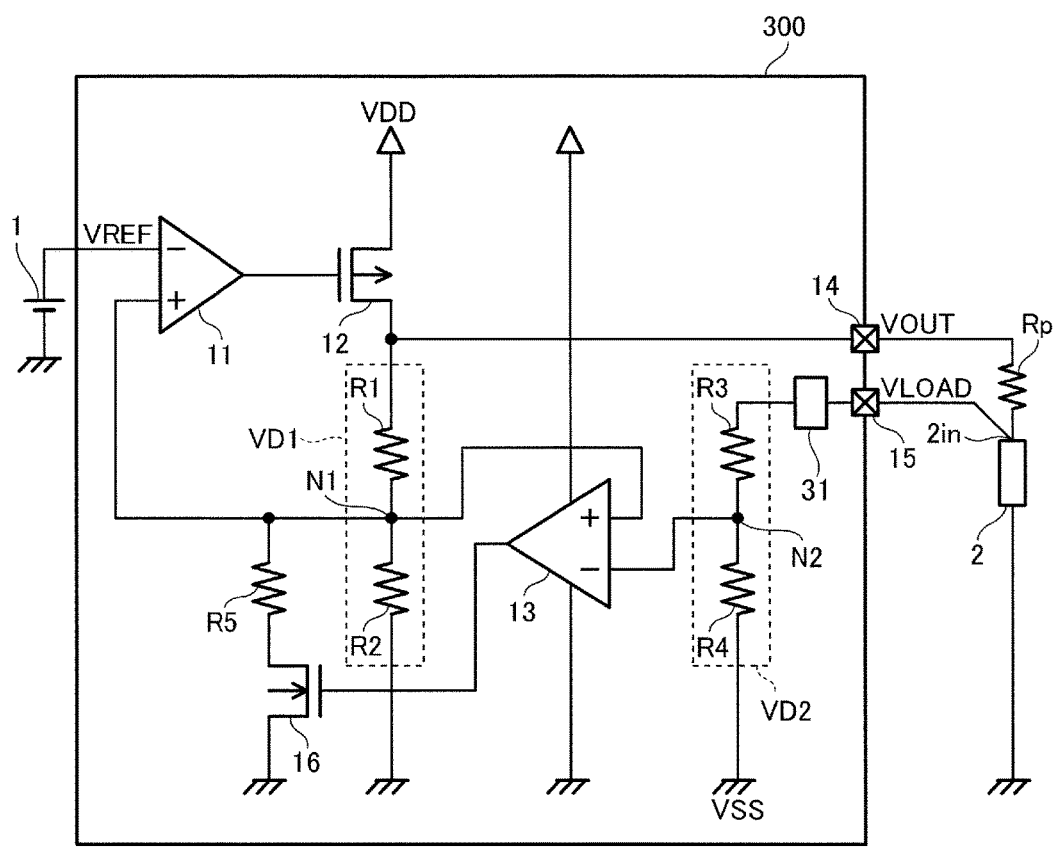
FIG. 3 is a circuit diagram for illustrating a voltage regulator according to a third embodiment of the present invention.

FIG. 3 is a circuit diagram of a voltage regulator 300 according to a third embodiment of the present invention.

The voltage regulator 300 includes, in addition to the components of the voltage regulator 100, a filter circuit 31 connected between the load voltage monitoring terminal 15 and the resistor R3.

According to the voltage regulator 300 configured as described above, the filter circuit 31 can positively remove external noise. The voltage regulator 300 can therefore operate more stably.

Fourth Embodiment

Figure 4:
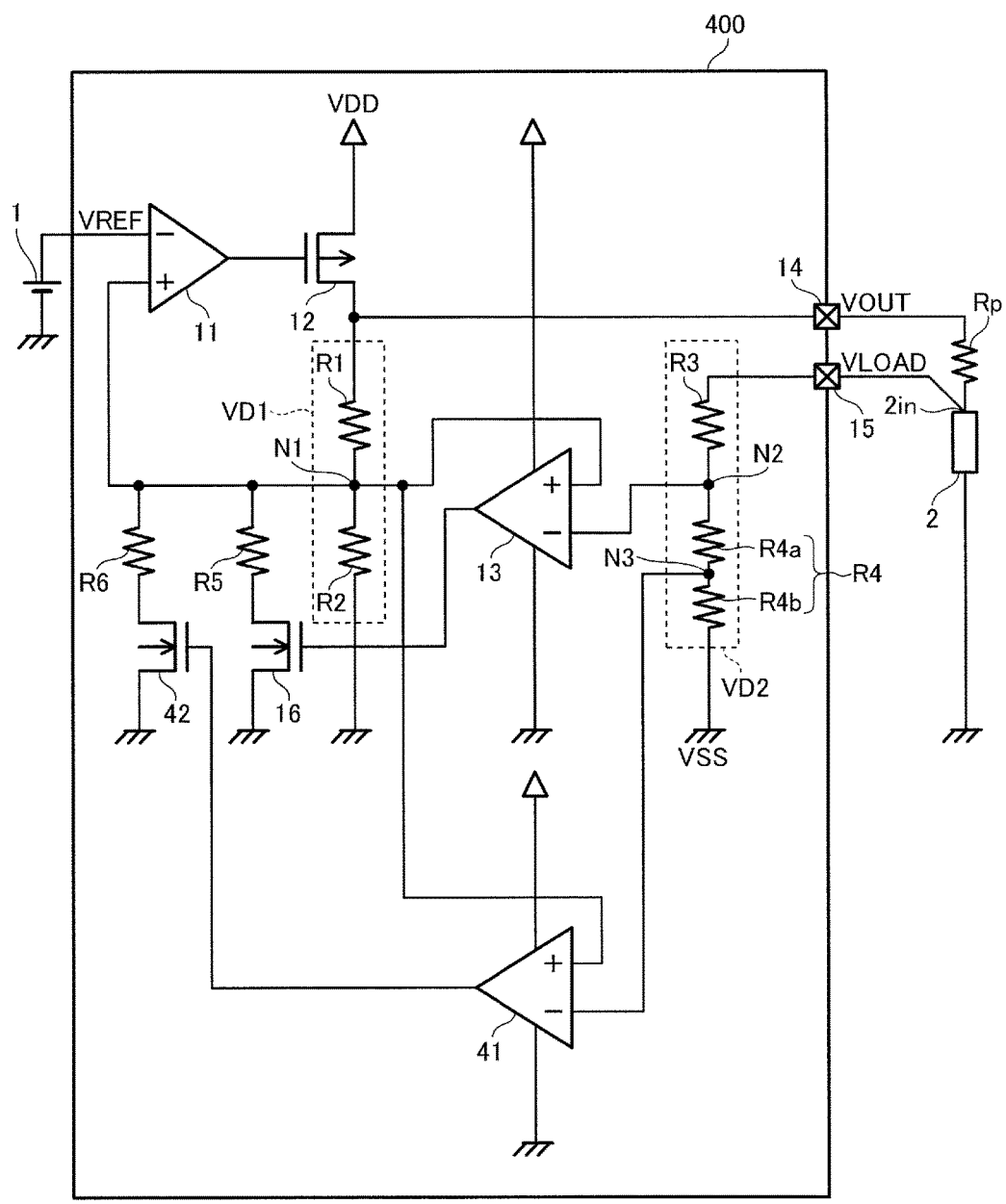
FIG. 4 is a circuit diagram for illustrating a voltage regulator according to a fourth embodiment of the present invention.

FIG. 4 is a circuit diagram of a voltage regulator 400 according to a fourth embodiment of the present invention.

The voltage regulator 400 includes, in addition to the components of the voltage regulator 100, a comparator 41 connected between the power supply terminal VDD and the ground terminal VSS, and a resistor R6 and a switching transistor 42 connected in series between the node N1 and the ground terminal VSS.

Further, the resistor R4 in the voltage regulator 100 is divided into resistors R4a and R4b. Specifically, the resistors R4a and R4b are connected in series between the node N2 and the ground terminal VSS via a node N3, and form a combined resistor having a resistance value that is equal to the resistance value of the resistor R4.

The comparator 41 compares the voltage at the node N1 and a voltage at the node N3 to each other, and outputs a signal for turning on the switching transistor 42 when the voltage at the node N3 falls below the voltage at the node N1 by a predetermined voltage amount or more. That is, an offset of the predetermined voltage amount is also added to an inverting input terminal of the comparator 41 as in the comparator 13.

In the voltage regulator 400 configured as described above, when a large current flows through the external load 2, and a voltage at the load voltage monitoring terminal 15 drops, the output of the comparator 41, which is configured to compare the voltage at the node N1 and the voltage at the node N3 to each other, first shifts to the high level, and the switching transistor 42 is turned on.

When the switching transistor 42 is turned on, the resistor R6 is consequently connected in parallel to the resistor R2 of the voltage divider circuit VD1, and the voltage at the node N1 drops. Thus, the output voltage of the error amplifier 11 drops, and a current that flows through the output transistor 12 increases, with the result that the output voltage VOUT at the output terminal 14 is to rise.

However, the voltage at the load voltage monitoring terminal 15 drops more when a larger current flows through the external load 2 at this time. Then, the output of the comparator 13 which is configured to compare the voltage at the node N1 and the voltage at the node N2 to each other shifts to the high level, and the switching transistor 16 is turned on.

Not only the resistor R6 but also the resistor R5 is consequently connected in parallel to the resistor R2 of the voltage divider circuit VD1, and the voltage at the node N1 drops more. Thus, the output voltage of the error amplifier 11 drops more, and the current that flows through the output transistor 12 increases more. In this manner, the output voltage VOUT at the output terminal 14 can be raised.

According to the fourth embodiment, a voltage that is supplied to the power supply input terminal 2*in* of the external load 2 can therefore be raised to the desired voltage even when a particularly large current flows through the external load 2.

Fifth Embodiment

Figure 5:
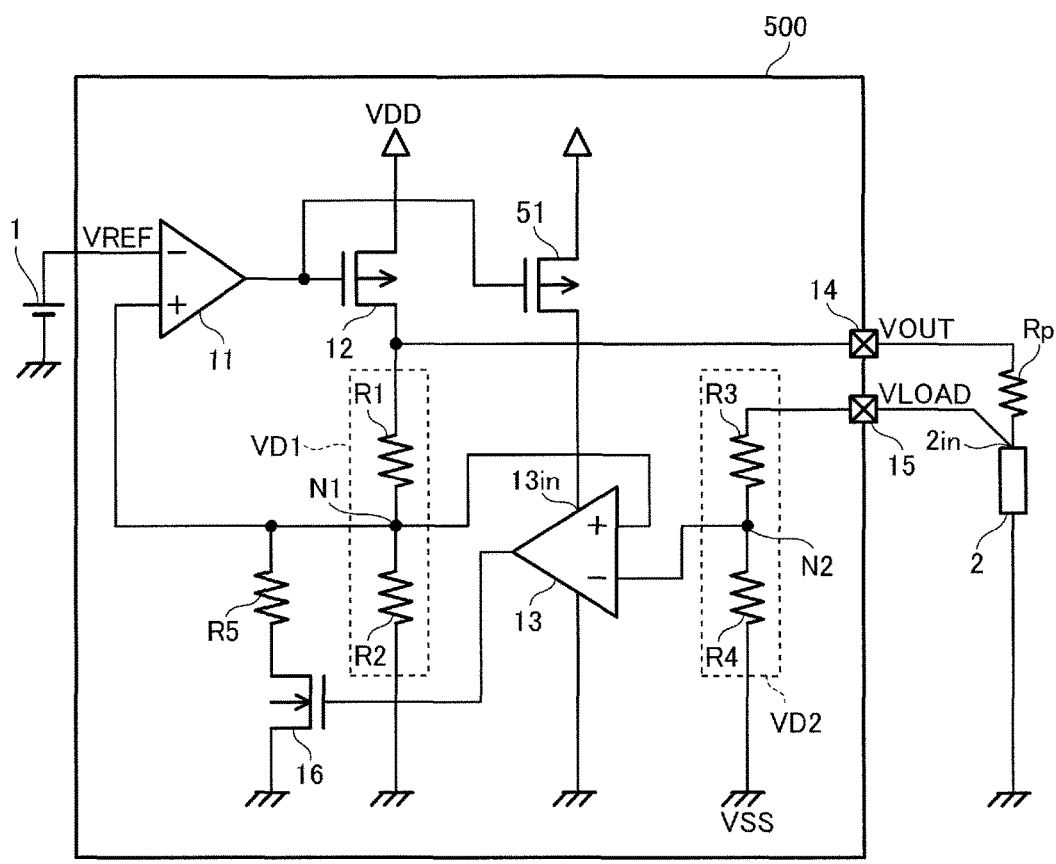
FIG. 5 is a circuit diagram for illustrating a voltage regulator according to a fifth embodiment of the present invention.

FIG. 5 is a circuit diagram of a voltage regulator 500 according to a fifth embodiment of the present invention.

The voltage regulator 500 includes, in addition to the components of the voltage regulator 100, a PMOS transistor 51 that is connected between the power supply terminal VDD and an operating current input terminal 13*in* of the comparator 13, has a gate connected to the gate of the output transistor 12, and functions as a current source.

In the voltage regulator 500 configured as described above, a current that flows through the PMOS transistor 51 is reduced when a small current flows through the external load 2, and the voltage drop due to the parasitic resistance Rp does not exceed the offset voltage of the comparator 13, that is, when the comparator 13 does not output the high level. The current that flows through the PMOS transistor 51 increases, on the other hand, when a large current flows through the external load 2, and the voltage drop due to the parasitic resistance Rp exceeds the offset voltage of the comparator 13, that is, when the comparator 13 outputs the high level.

According to the fifth embodiment, it is therefore possible to prevent the comparator 13 from being always supplied with a constant operating current, to thereby reduce the current consumption of the voltage regulator 500.

When the configuration of the fifth embodiment is applied to the voltage regulator 400 of the fourth embodiment, which is illustrated in FIG. 4, a PMOS transistor that has a gate connected to the gate of the output transistor 12 and functions as a current source is preferably connected between the power supply terminal VDD and an operating current input terminal of the comparator 41 as well as between the power supply terminal VDD and the operating current input terminal of the comparator 13.

The embodiments of the present invention have been described above, but the present invention is not limited to the above-mentioned embodiments, and it should be understood that various modifications can be made thereto without departing from the gist of the present invention.

For example, in the voltage regulator of each embodiment described above, hysteresis may be given to the inverting input terminal of the comparator as needed.

What is claimed is:
1. A voltage regulator, comprising:
an output transistor having a source connected to a first power supply terminal;
an output terminal from which a voltage at a drain of the output transistor is output, and connected to a power supply input terminal of an external load;
a first voltage divider circuit having a first resistor and a second resistor connected in series between the drain of the output transistor and a second power supply terminal via a first node;
a load voltage monitoring terminal to which a voltage at the power supply input terminal of the external load is input;
a second voltage divider circuit having a third resistor and a fourth resistor connected in series between the load voltage monitoring terminal and the second power supply terminal via a second node;
a fifth resistor and a first switching transistor connected in series between the first node and the second power supply terminal; and
a first comparator connected between the first power supply terminal and the second power supply terminal, and is configured to:
compare a voltage at the first node and a voltage at the second node to each other; and
output a signal for turning on the first switching transistor when the voltage at the second node falls below the voltage at the first node by a first predetermined voltage amount or more,
a ratio between a resistance value of the first resistor and a resistance value of the second resistor being the same as a ratio between a resistance value of the third resistor and a resistance value of the fourth resistor, and
a voltage at a gate of the output transistor being reduced so that a voltage at the output terminal is raised when the voltage at the first node falls below a reference voltage.
2. A voltage regulator according to claim 1, further comprising a switching circuit connected between a gate of the first switching transistor and the second power supply terminal,
wherein the switching circuit is configured to turn on when at least one of an overheat protection function or an overcurrent protection function operates.
3. A voltage regulator according to claim 1, further comprising a filter circuit connected between the load voltage monitoring terminal and the third resistor.
4. A voltage regulator according to claim 2, further comprising a filter circuit connected between the load voltage monitoring terminal and the third resistor.
5. A voltage regulator according to claim 1, further comprising:
a second comparator connected between the first power supply terminal and the second power supply terminal; and
a sixth resistor and a second switching transistor connected in series between the first node and the second power supply terminal,
wherein the fourth resistor comprises a first division resistor and a second division resistor connected in series between the second node and the second power supply terminal via a third node, and form a combined resistor having a resistance value that is equal to a resistance value of the fourth resistor, and wherein the second comparator is configured to:
compare the voltage at the first node and a voltage at the third node to each other; and
output a signal for turning on the second switching transistor when the voltage at the third node falls below the voltage at the first node by a second predetermined voltage amount or more.

6. A voltage regulator according to claim 2, further comprising:
a second comparator connected between the first power supply terminal and the second power supply terminal; and
a sixth resistor and a second switching transistor connected in series between the first node and the second power supply terminal,
wherein the fourth resistor comprises a first division resistor and a second division resistor connected in series between the second node and the second power supply terminal via a third node, and form a combined resistor having a resistance value that is equal to a resistance value of the fourth resistor, and
wherein the second comparator is configured to:
compare the voltage at the first node and a voltage at the third node to each other; and
output a signal for turning on the second switching transistor when the voltage at the third node falls below the voltage at the first node by a second predetermined voltage amount or more.

7. A voltage regulator according to claim 3, further comprising:
a second comparator connected between the first power supply terminal and the second power supply terminal; and
a sixth resistor and a second switching transistor connected in series between the first node and the second power supply terminal,
wherein the fourth resistor comprises a first division resistor and a second division resistor connected in series between the second node and the second power supply terminal via a third node, and form a combined resistor having a resistance value that is equal to a resistance value of the fourth resistor, and
wherein the second comparator is configured to:
compare the voltage at the first node and a voltage at the third node to each other; and
output a signal for turning on the second switching transistor when the voltage at the third node falls below the voltage at the first node by a second predetermined voltage amount or more.

8. A voltage regulator according to claim 4, further comprising:
a second comparator connected between the first power supply terminal and the second power supply terminal; and
a sixth resistor and a second switching transistor connected in series between the first node and the second power supply terminal,
wherein the fourth resistor comprises a first division resistor and a second division resistor connected in series between the second node and the second power supply terminal via a third node, and form a combined resistor having a resistance value that is equal to a resistance value of the fourth resistor, and
wherein the second comparator is configured to:
compare the voltage at the first node and a voltage at the third node to each other; and
output a signal for turning on the second switching transistor when the voltage at the third node falls below the voltage at the first node by a second predetermined voltage amount or more.

9. A voltage regulator according to claim 1, further comprising a PMOS transistor connected between the first power supply terminal and an operating current input terminal of the first comparator, and having a gate connected to the gate of the output transistor.

10. A voltage regulator according to claim 2, further comprising a PMOS transistor connected between the first power supply terminal and an operating current input terminal of the first comparator, and having a gate connected to the gate of the output transistor.

11. A voltage regulator according to claim 3, further comprising a PMOS transistor connected between the first power supply terminal and an operating current input terminal of the first comparator, and having a gate connected to the gate of the output transistor.

12. A voltage regulator according to claim 4, further comprising a PMOS transistor connected between the first power supply terminal and an operating current input terminal of the first comparator, and having a gate connected to the gate of the output transistor.

13. A voltage regulator according to claim 1, wherein the first voltage divider circuit and the second voltage divider circuit have the same structure.

14. A voltage regulator according to claim 2, wherein the first voltage divider circuit and the second voltage divider circuit have the same structure.

15. A voltage regulator according to claim 3, wherein the first voltage divider circuit and the second voltage divider circuit have the same structure.

16. A voltage regulator according to claim 4, wherein the first voltage divider circuit and the second voltage divider circuit have the same structure.

* * * * *